(12) United States Patent
Lee et al.

(10) Patent No.: US 9,806,059 B1
(45) Date of Patent: Oct. 31, 2017

(54) MULTI-STACK PACKAGE-ON-PACKAGE STRUCTURES

(71) Applicant: Taiwan Semiconductor Manufacturing Company, Ltd., Hsin-Chu (TW)

(72) Inventors: Chi-Jung Lee, Taoyuan (TW); Hsien-Wei Chen, Hsin-Chu (TW); An-Jhih Su, Bade (TW); Wei-Yu Chen, Hsin-Bei (TW); Tien-Chung Yang, Hsin-Chu (TW); Li-Hsien Huang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/153,368

(22) Filed: May 12, 2016

(51) Int. Cl.
  *H01L 23/48* (2006.01)
  *H01L 25/065* (2006.01)
  (Continued)

(52) U.S. Cl.
  CPC .......... *H01L 25/0652* (2013.01); *H01L 21/56* (2013.01); *H01L 21/6835* (2013.01); *H01L 21/76885* (2013.01); *H01L 21/76898* (2013.01); *H01L 21/78* (2013.01); *H01L 23/3128* (2013.01); *H01L 23/481* (2013.01); *H01L 24/17* (2013.01); *H01L 25/0657* (2013.01); *H01L 25/18* (2013.01); *H01L 25/50* (2013.01); *H01L 2221/68327* (2013.01); *H01L 2224/023* (2013.01); *H01L 2224/03462* (2013.01); *H01L 2224/03464* (2013.01); *H01L 2224/0401* (2013.01); *H01L 2224/0508* (2013.01); *H01L 2224/05124* (2013.01); *H01L 2224/05147* (2013.01); *H01L 2224/05166* (2013.01); *H01L 2224/05184* (2013.01); *H01L 2224/13022* (2013.01); *H01L 2224/13124* (2013.01); *H01L 2224/13147* (2013.01); *H01L 2224/13155* (2013.01); *H01L 2224/13184* (2013.01); *H01L 2224/16145* (2013.01); *H01L 2225/06513* (2013.01); *H01L 2225/06548* (2013.01);
  (Continued)

(58) Field of Classification Search
  CPC . H01L 25/0652; H01L 25/0657; H01L 25/18; H01L 25/50; H01L 21/56; H01L 21/6835; H01L 21/76885; H01L 21/76898; H01L 21/78; H01L 23/3128; H01L 23/481; H01L 24/17
  USPC ........................................................ 257/774
  See application file for complete search history.

(56) References Cited

U.S. PATENT DOCUMENTS 8,361,842 B2  1/2013  Yu et al.
8,680,647 B2  3/2014  Yu et al.
(Continued)

*Primary Examiner* — Tu-Tu Ho
(74) *Attorney, Agent, or Firm* — Slater Matsil, LLP

(57) ABSTRACT

Multi-stack package-on-package structures are disclosed. In a method, a first stacked semiconductor device is formed on a first carrier wafer. The first stacked semiconductor device is singulated. The first stacked semiconductor device is adhered to a second carrier wafer. A second semiconductor device is attached on the first stacked semiconductor device. The second semiconductor device and the first stacked semiconductor device are encapsulated. Electrical connections are formed on and electrically coupled to the first stacked semiconductor device and the second semiconductor device.

20 Claims, 25 Drawing Sheets

(51) Int. Cl.
*H01L 21/78* (2006.01)
*H01L 25/00* (2006.01)
*H01L 21/56* (2006.01)
*H01L 25/18* (2006.01)
*H01L 21/683* (2006.01)
*H01L 21/768* (2006.01)
*H01L 23/31* (2006.01)
*H01L 23/00* (2006.01)

(52) U.S. Cl.
CPC ........... *H01L 2225/06562* (2013.01); *H01L 2924/0105* (2013.01); *H01L 2924/01013* (2013.01); *H01L 2924/01022* (2013.01); *H01L 2924/01028* (2013.01); *H01L 2924/01029* (2013.01); *H01L 2924/0132* (2013.01); *H01L 2924/0133* (2013.01); *H01L 2924/01046* (2013.01); *H01L 2924/01047* (2013.01); *H01L 2924/01049* (2013.01); *H01L 2924/01074* (2013.01); *H01L 2924/01079* (2013.01); *H01L 2924/01082* (2013.01); *H01L 2924/143* (2013.01); *H01L 2924/1434* (2013.01); *H01L 2924/15311* (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0084456 | A1* | 3/2014 | Kang .................. H01L 21/563 257/737 |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |

* cited by examiner

MULTI-STACK PACKAGE-ON-PACKAGE STRUCTURES

BACKGROUND

In a conventional Integrated Fan-Out (InFO) processes, a top package, in which a first device die is bonded, is bonded to a bottom package. The bottom package may also have a device die packaged therein. By adopting the InFO process, the integration level of the packages is increased.

In an existing InFO process, the bottom package is formed first, which includes encapsulating a molding compound on a device die and a plurality of through-molding vias. Redistribution lines are formed to connect to the device die and the through-molding vias. A top package, which may include device dies bonded to an additional package substrate, is then bonded to the bottom package through solder joints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
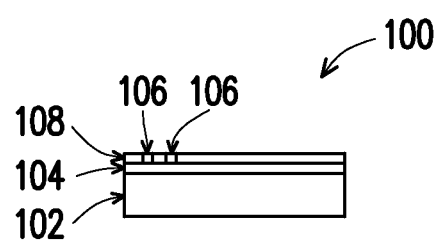
FIGS. 1-12 illustrate cross-sectional views of intermediate stages in the formation of a package including multi-stack dies, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multi-stack (MUST) package and the method of forming the package are provided in accordance with various embodiments. Some variations of some embodiments are discussed. Throughout the various views and illustrative embodiments, like reference numbers are used to designate like elements. Throughout the description, the term "multi-stack package" or "MUST package" refers to a package in which two or more levels of device dies, each encapsulated in an encapsulating material, have no solder regions therebetween. Furthermore, throughout the description, the surfaces of device dies having connectors are referred to as the front surfaces of the respective device dies, and the surfaces opposite to the front surfaces are back surfaces. The back surfaces are also the surfaces of semiconductor substrates of the respective device dies, in accordance with some embodiments. A MUST package may be measured according to the quantity of die layers that are stacked to form the package. For example, a MUST package with two layers of dies may be referred to as a two-layer (2L) MUST package. Each layer of a MUST package includes one or more dies arranged side-by-side.

According to embodiments of the present disclosure, a final MUST package is formed by stacking several layers of semiconductor devices. The semiconductor devices may be smaller MUST packages that have been previously formed and singulated during intermediate processing steps. In such embodiments, the final MUST package may be formed by stacking the several smaller MUST packages in a vertical direction. For example, a three-layer (3L) MUST package may be formed by packaging a 2L MUST package and a one-layer (1L) MUST package. Forming the final MUST package from several smaller MUST packages may produce a final package with lower warpage than a MUST package formed in a single, monolithic stacking process. Formation and singulation of the smaller MUST packages may relieve warpage in the smaller MUST packages, reducing overall warpage in the final package. In some embodiments, functionality of the smaller MUST packages is tested before they are assembled and only known good packages, which only include known good dies, are assembled. Testing the packages at intermediate stages may increase overall yield rate by affording an opportunity to stop processing of or rework bad packages. Forming the final MUST package from several smaller MUST packages may also reduce the footprint size of the final package, as the package routing for each device layer of 1L and 2L packages may be smaller and simpler than the package routing required by a 3L package. Accordingly, embodiments may reduce the fan-out ratio of device packages, e.g., the area occupied by the device dies over the area occupied by the fan-out package.

FIG. 1 illustrates a cross-sectional view of an integrated circuit die 100, in accordance with some embodiments. The integrated circuit die 100 includes a substrate 102, an interconnect 104, die connectors 106, and a dielectric material 108. The integrated circuit die 100 may be a memory device such as a Static Random Access Memory (SRAM)

device, a Dynamic Random Access Memory (DRAM) device, a flash memory device, etc. The integrated circuit die 100 may be a processing device such as a system-on-chip (SoC), a microcontroller, a processor, or the like.

The substrate 102 has a front surface (e.g., the surface facing upwards in FIG. 1), sometimes called an active side, and a back surface (e.g., the surface facing downwards in FIG. 1), sometimes called an inactive side. The substrate 102 may be a semiconductor, such as silicon, doped or undoped, or an active layer of a semiconductor-on-insulator (SOI) substrate. The substrate 102 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the substrate 102 and may be interconnected by the interconnect 104 formed by, for example, metallization patterns in one or more dielectric layers on the substrate 102 to form an integrated circuit.

In accordance with some embodiments, through-vias do not extend though the substrate 102. In such embodiments, electrical connections for interconnecting the conductive features of the integrated circuit die 100, e.g., the interconnect 104, may only be located on the front surface of the integrated circuit die 100. Accordingly, through-vias do not need to be formed in the substrate 102, thereby reducing the manufacturing cost of the integrated circuit die 100.

The die connectors 106 may be conductive pillars (for example, comprising a metal such as copper, aluminum, tungsten, nickel, or alloys thereof), and are mechanically and electrically coupled to the interconnect 104. The die connectors 106 may be formed by, for example, plating, or the like. The die connectors 106 electrically couple the respective integrated circuits of the integrated circuit die 100.

A dielectric material 108 is on the active side of the integrated circuit die 100, such as on the interconnect 104. The dielectric material 108 laterally encapsulates the die connectors 106, and the dielectric material 108 is laterally coterminous with the integrated circuit die 100. The dielectric material 108 may be a polymer such as polybenzoxazole (PBO), polyimide, BCB, or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof, and may be formed, for example, by spin coating, lamination, CVD, or the like.

FIGS. 2-12 illustrate cross-sectional views of intermediate stages in the formation of a first package structure, in accordance with some embodiments. A first package region 200a and a second package region 200b for the formation of a first package and a second package, respectively, are illustrated.

Figure 2:
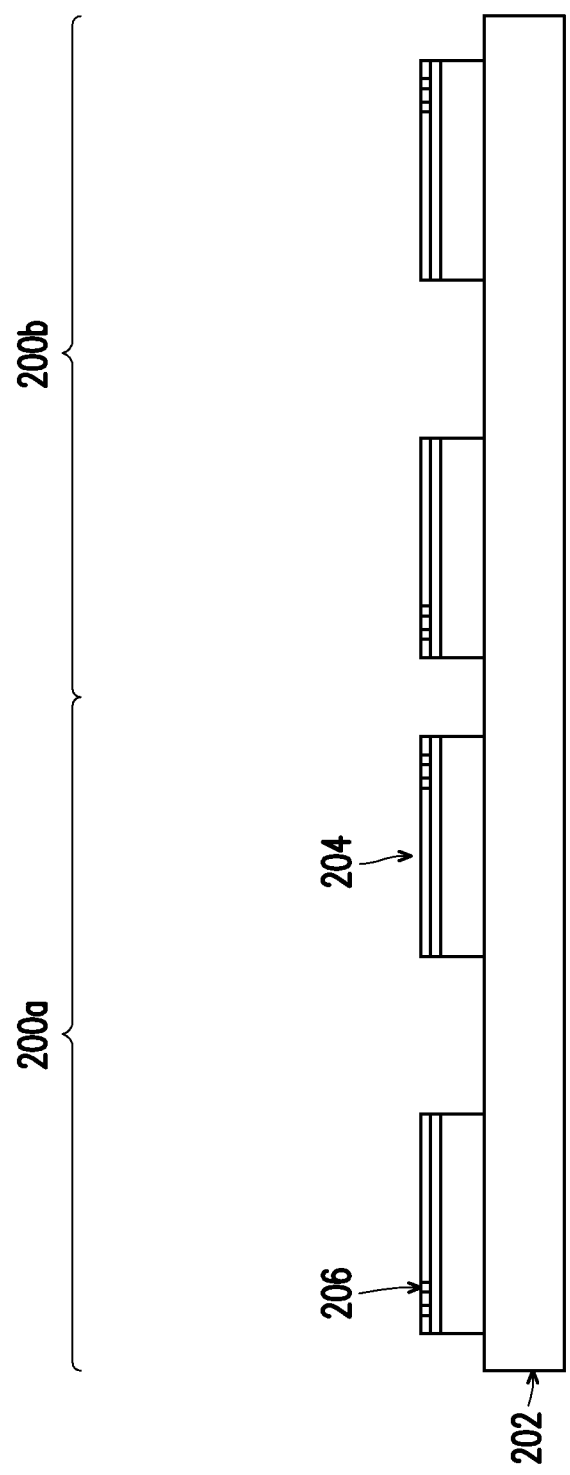

In FIG. 2, integrated circuit dies 204 are attached to a carrier substrate 202. Two integrated circuit dies 204, having die connectors 206, are adhered in each of the first package region 200a and the second package region 200b. In other embodiments, more or less integrated circuit dies 204 may be adhered in each region.

The carrier substrate 202 may be a glass carrier, a ceramic carrier, or the like. The carrier substrate 202 may be a wafer with a round top-view shape, such that multiple packages can be formed on the carrier substrate 202 simultaneously.

The integrated circuit dies 204 may be similar to the integrated circuit die 100. In some embodiments the integrated circuit dies 204 are each a single die, such as a memory die. In some embodiments, the integrated circuit dies 204 are each multi-stack devices that include multiple dies, e.g., multiple memory dies. The integrated circuit dies 204 may be adhered to the carrier substrate 202 with an adhesive (not shown). The adhesive may be any suitable adhesive, epoxy, die attach film (DAF), or the like. The adhesive may be applied to a back-side of the integrated circuit dies 204, such as to a back-side of the respective semiconductor wafer or may be applied over the surface of the carrier substrate 202. The integrated circuit dies 204 may be singulated, such as by sawing or dicing, and adhered to the carrier substrate 202 by the adhesive using, for example, a pick-and-place tool. The die connectors 206 may be similar to the die connectors 106 of the integrated circuit die 100.

Figure 3:
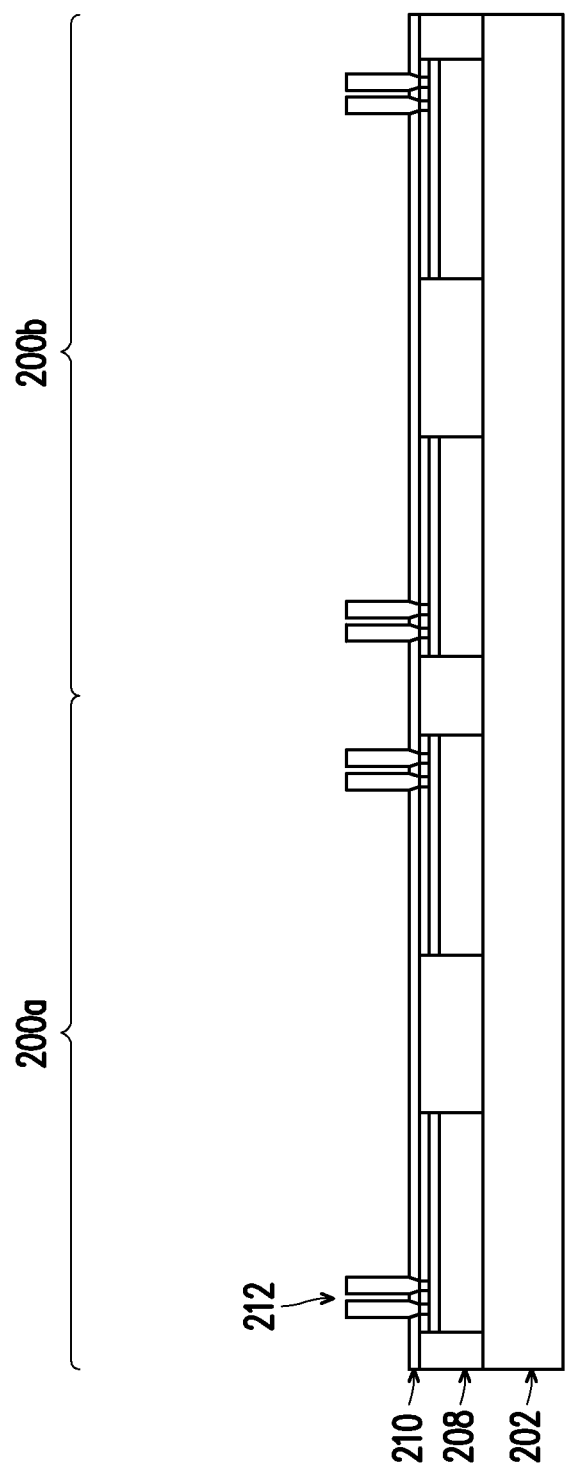

In FIG. 3, an encapsulant 208 is formed on the carrier substrate 202 and around the integrated circuit dies 204. A dielectric layer 210 is then formed over the integrated circuit dies 204 and the encapsulant 208. Conductive vias 212 are then formed contacting the die connectors 206 of the integrated circuit dies 204.

The encapsulant 208 may be a molding compound, epoxy, or the like, and may be applied by compression molding, transfer molding, or the like. After curing, the encapsulant 208 may undergo a grinding process to expose the die connectors 206 of the integrated circuit dies 204. Top surfaces of the integrated circuit dies 204 and the encapsulant 208 are coplanar after the grinding process. In some embodiments, the grinding may be omitted, for example, if the integrated circuit dies 204 are already exposed.

The dielectric layer 210 is then formed over the integrated circuit dies 204 and the encapsulant 208. The dielectric layer 210 may be formed from the same material as the dielectric material 108. The dielectric layer 210 may be formed by any acceptable deposition process, such as spin coating, chemical vapor deposition (CVD), laminating, the like, or a combination thereof. Openings (not labeled) are then formed in the dielectric layer 210 such that the die connectors 206 of the integrated circuit dies 204 are exposed.

The conductive vias 212 are formed extending away from the dielectric layer 210. As an example to form the conductive vias 212, a seed layer (not shown) is formed over the dielectric layer 210 and the exposed die connectors 206 of the integrated circuit dies 204. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist (not shown) is formed and patterned on the seed layer. The photo resist may be formed by spin coating or the like and may be exposed to light for patterning. The pattern of the photo resist corresponds to the exposed die connectors 206 of the integrated circuit dies 204. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the conductive vias 212.

Figure 4:
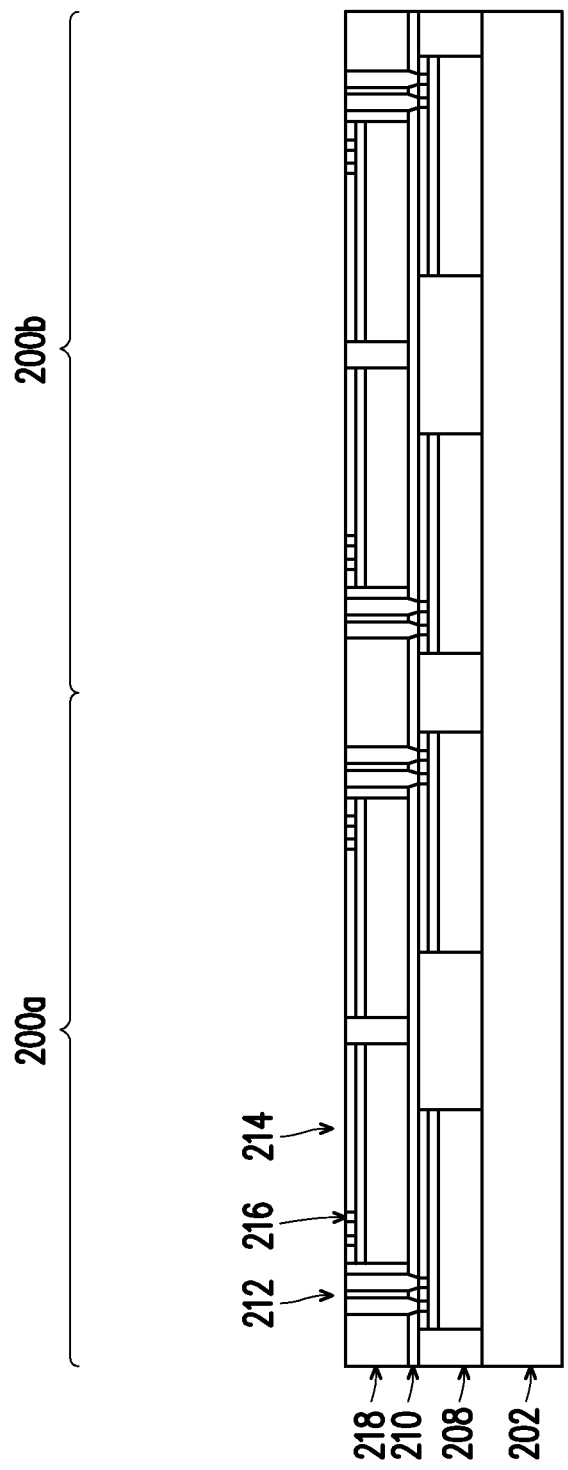

In FIG. 4, integrated circuit dies 214, having die connectors 216, are attached to the dielectric layer 210. An encapsulant 218 is then formed on the dielectric layer 210, around the conductive vias 212 and the integrated circuit dies 214.

The integrated circuit dies 214 are adhered to the dielectric layer 210 by an adhesive (not shown) using, for example, a pick-and-place tool. The integrated circuit dies 214 may be adhered using similar techniques and adhesives as the integrated circuit dies 204, or may be adhered using different techniques and adhesives. The integrated circuit dies 214 are placed such that each of the first package region 200a and the second package region 200b include two of the integrated circuit dies 214. The integrated circuit dies 214 are placed between the conductive vias 212 of each of the integrated circuit dies 204 in the first package region 200a and the second package region 200b. In other words, each of the first package region 200a and the second package region 200b are arranged such that the conductive vias 212 are positioned nearer the lateral edges of the package regions and surround the integrated circuit dies 214. Like the integrated circuit dies 204, the integrated circuit dies 214 may be formed in a manner similar to the integrated circuit die 100, and may be a memory device or a processing device.

The encapsulant 218 may be similar to the encapsulant 208, and may be formed using similar or different techniques. After curing, the encapsulant 218 may undergo a grinding process to expose the conductive vias 212 and the integrated circuit dies 214. After grinding, the conductive vias 212 extend through the encapsulant 218. Such vias may be referred to as through mold vias. Because the through mold vias are formed in an encapsulant, they do not need to be formed through substrates such as the integrated circuit dies 214. Through substrate vias may be more expensive to form than through mold vias.

Figure 5:
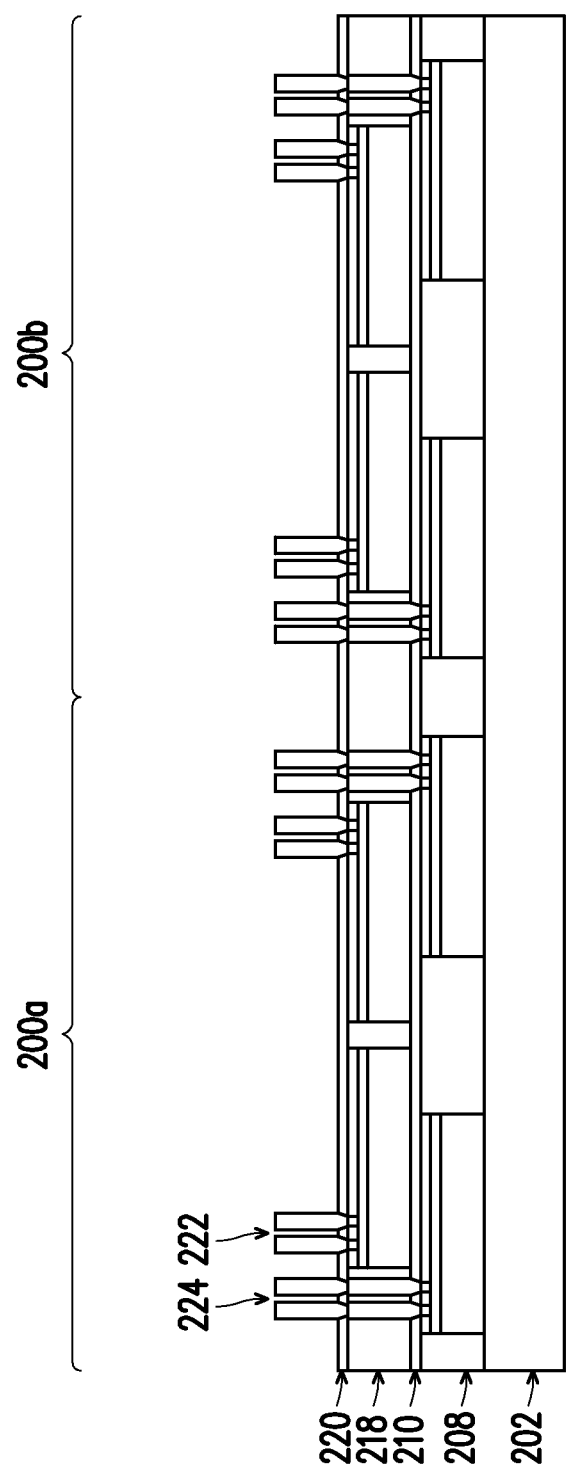

In FIG. 5, a dielectric layer 220 is formed over the integrated circuit dies 214 and the encapsulant 218. Conductive vias 222 and 224 are then formed extending away from the dielectric layer 220.

The dielectric layer 220 may be formed using the same material and techniques as the dielectric layer 210. Openings (not labeled) are then formed in the dielectric layer 220 such that the conductive vias 212 and the die connectors 216 of the integrated circuit dies 214 are exposed.

The conductive vias 222 are formed in contact with the die connectors 216 of the integrated circuit dies 214. The conductive vias 224 are formed in contact with the conductive vias 212. The conductive vias 222 and the conductive vias 224 may be formed with, e.g., a plating process, and may be formed in a same process, or in a different process. In embodiments where the conductive vias 222 and the conductive vias 224 are formed in a same process, they may be formed in a manner similar to how the conductive vias 212 are formed. In such embodiments, the photo resist (discussed above) is patterned on the seed layer with a pattern corresponding to both the conductive vias 212 and the die connectors 216 of the integrated circuit dies 214. The plating process (discussed above) then simultaneously forms the conductive vias 222 and the conductive vias 224.

Once the conductive vias 222 and 224 are formed, a functional test may be performed on the dies in the first package region 200a and the second package region 200b.

The functional test may be performed to verify connectivity to the integrated circuit dies 204 and 214 through the conductive vias 212, 222, and 224. The functional test may also be performed to verify certain functionality of the integrated circuit dies 204 and 214. By performing functional tests on the integrated circuit dies 204 and 214 at this point in processing, only known good packages may be further processed. Packages that fail the functional tests may be reworked or not used. Thus, cost savings may be obtained by avoiding further processing of the first package region 200a and/or the second package region 200b.

Figure 6:
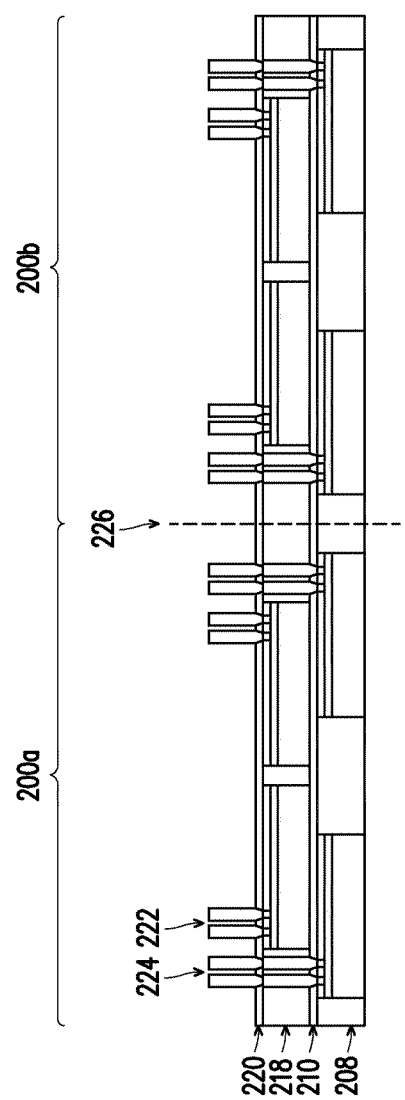

In FIG. 6, a carrier substrate removal is performed to detach (de-bond) the carrier substrate 202 from the back side of the first package structure. De-bonding may be accomplished through, e.g., use of a release layer (not shown) that is interposed between the carrier substrate 202, and the first package region 200a and the second package region 200b. In such embodiments, de-bonding includes projecting a light such as a laser light or an UV light on the release layer so that the release layer decomposes under the heat of the light and the carrier substrate 202 can be removed. In some embodiments, the first package structure may be flipped over and placed on a dicing tape before the de-bonding is performed.

Further in FIG. 6, a singulation process is performed by sawing 226 along scribe line regions e.g., between adjacent regions such as the first package region 200a and the second package region 200b.

Figure 7:
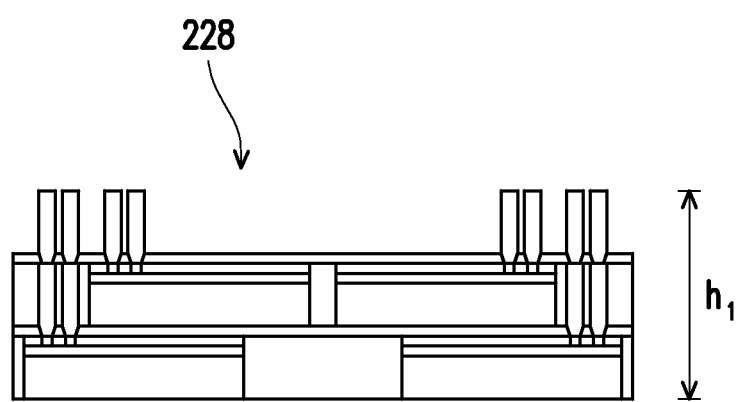

FIG. 7 illustrates an intermediate singulated package, which may be from one of the first package region 200a or the second package region 200b. The singulated packages may also be referred to as MUST packages 228. In the example illustrated in FIGS. 2-7, the MUST packages 228 include two layers of dies (e.g., the integrated circuit dies 204 and 214). Accordingly, the MUST packages 228 are two-layer (2L) MUST packages. Because the MUST packages 228 are formed without intermediate solder layers, they may have a lower height than traditional InFO packages. For example, the MUST packages 228 may have a height $h_1$ of less than about 150 μm.

Figure 8:
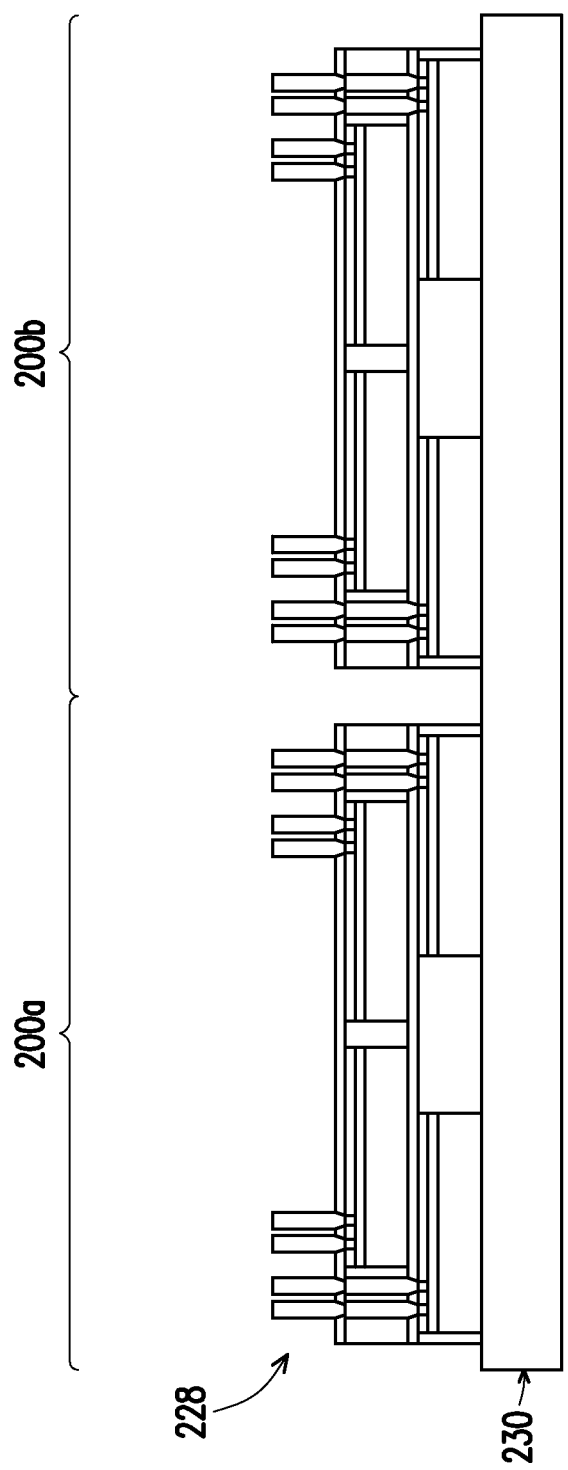

In FIG. 8, the MUST packages 228 are re-attached to a carrier substrate 230. One of the MUST packages 228 are adhered in each of the first package region 200a and the second package region 200b. As discussed above, the MUST packages 228 are known good packages that were determined through functional testing before or after singulation.

The carrier substrate 230 may be similar to the carrier substrate 202. In some embodiments, the carrier substrate 230 is the carrier substrate 202, e.g., the carrier substrate 202 is recycled for further processing. The MUST packages 228 may be adhered to the carrier substrate 230 by an adhesive (not show) using, for example, a pick-and-place tool. In some embodiments, the MUST packages 228 are placed closer to one another on the carrier substrate 230 than the integrated circuit dies 204 were placed on the carrier substrate 202.

Figure 9:
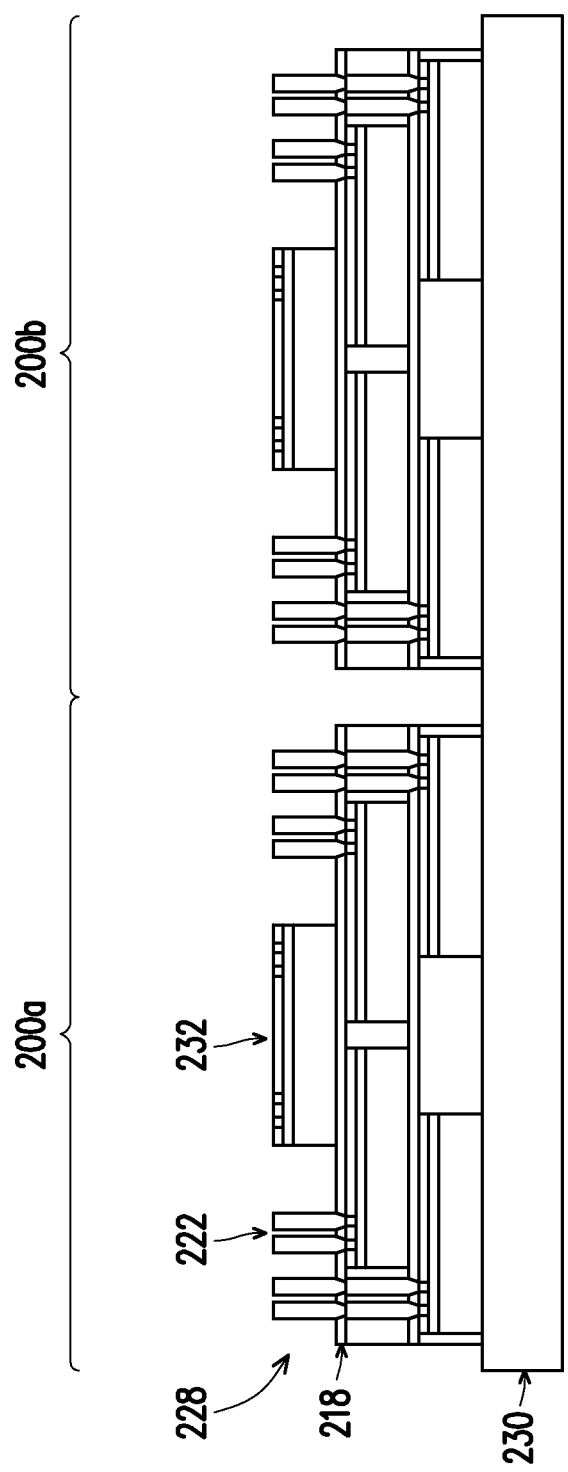

In FIG. 9, integrated circuit dies 232 are attached to the MUST packages 228. The integrated circuit dies 232 may be adhered to the dielectric layer 220 and between the conductive vias 222 of the MUST packages 228 by an adhesive (not shown) using, for example, a pick-and-place tool.

The integrated circuit dies 232 may be a different type of integrated circuit die than the integrated circuit dies 204 and 214 in the MUST packages 228. For example, in some embodiments the integrated circuit dies 232 may be processing devices, while the integrated circuit dies 204 and 214 may be memory devices. In some embodiments the integrated circuit dies 232 may be MUST packages with two, three, or four layers. In such embodiments, the integrated circuit dies 232 may be function tested to confirm that they are known good dies.

Figure 10:
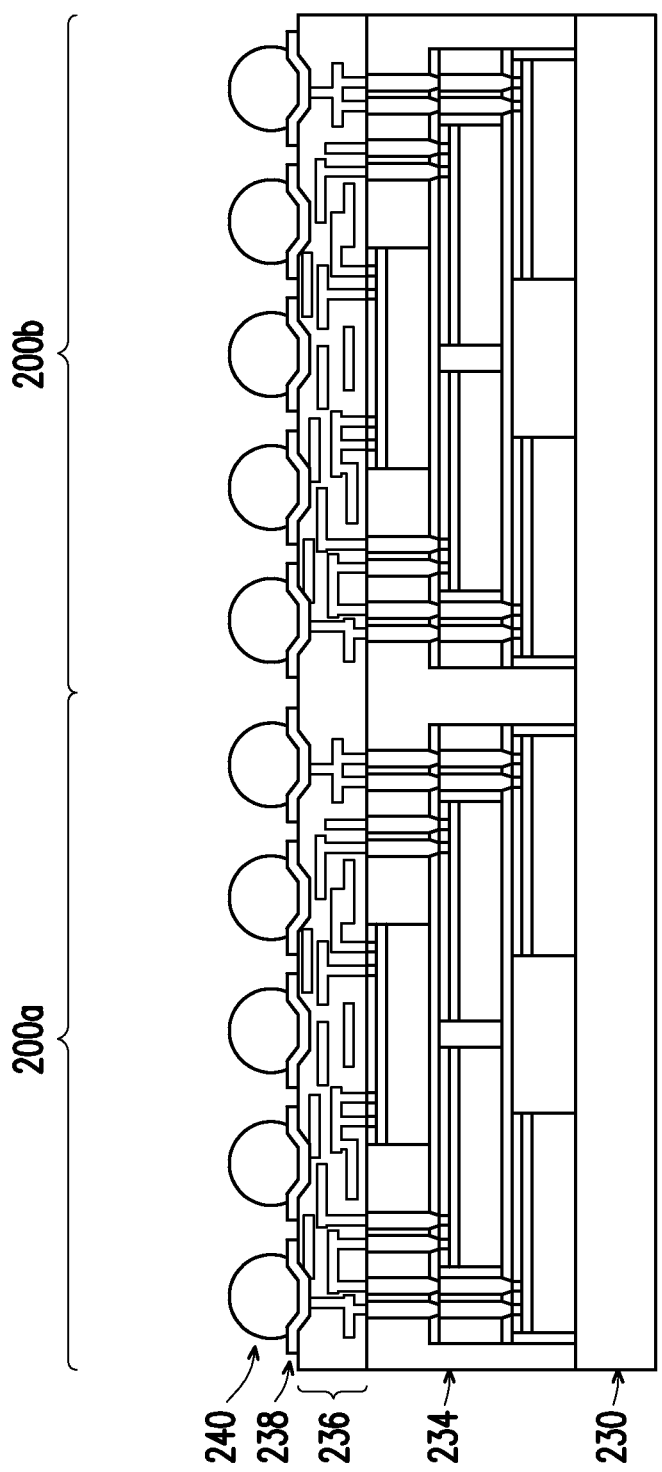

In FIG. 10, an encapsulant 234 is formed on the carrier substrate 230, over the MUST packages 228 and the integrated circuit dies 232. A front-side redistribution structure 236 is then formed over the encapsulant 234, and pads 238 are formed on the front-side redistribution structure 236. Conductive connectors 240 are then formed on the pads 238.

The encapsulant 234 may be a molding compound, and may be formed such that the MUST packages 228 and the integrated circuit dies 232 are covered. After curing, the encapsulant 234 may undergo a grinding process to expose die connectors of the integrated circuit dies 232 and conductive vias of the MUST packages 228 (e.g., the conductive vias 222 and 224). Top surfaces of the integrated circuit dies 232 and the encapsulant 234 are coplanar after the grinding process. In some embodiments, the grinding may be omitted, for example, if the integrated circuit dies 232 and the conductive vias 222 and 224 are already exposed.

The front-side redistribution structure 236 is formed to electrically couple the MUST packages 228 and the integrated circuit dies 232 to external connections, such as the pads 238. It should be appreciated that the illustration of the front-side redistribution structure 236 throughout all figures is schematic. For example, the front-side redistribution structure 236 may actually patterned as a plurality of discrete portions separated from each other by respective dielectric layer(s). The front-side redistribution structure 236 may be, e.g., redistribution layers (RDLs), and may include metal traces (or metal lines) and vias underlying and connected to the metal traces. In accordance with some embodiments of the present disclosure, the RDLs are formed through plating processes, wherein each of the RDLs includes a seed layer (not shown) and a plated metallic material over the seed layer. The seed layer and the plated metallic material may be formed of the same material or different materials.

The pads 238 are formed on an exterior side of the front-side redistribution structure 236. The pads 238 are used to couple to the conductive connectors 240, and may be referred to as under bump metallurgies (UBMs). In the illustrated embodiment, the pads 238 are formed through openings in dielectric layers of the front-side redistribution structure 236 to contact metallization patterns in the front-side redistribution structure 236. As an example to form the pads 238, a seed layer (not shown) is formed over the front-side redistribution structure 236. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to exposed metallization patterns of the front-side redistribution structure 236. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 238. In embodiments where the pads 238 are formed differently, more photo resist and patterning steps may be utilized.

The conductive connectors 240 are formed on the pads 238. The conductive connectors 240 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 240 may include a conductive material such as solder, copper, aluminum, gold, nickel, silver, palladium, tin, the like, or a combination thereof. In some embodiments, the conductive connectors 240 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 240 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 240. The metal cap layer may include nickel, tin, tin-lead, gold, silver, palladium, indium, nickel-palladium-gold, nickel-gold, the like, or a combination thereof and may be formed by a plating process.

Figure 11:
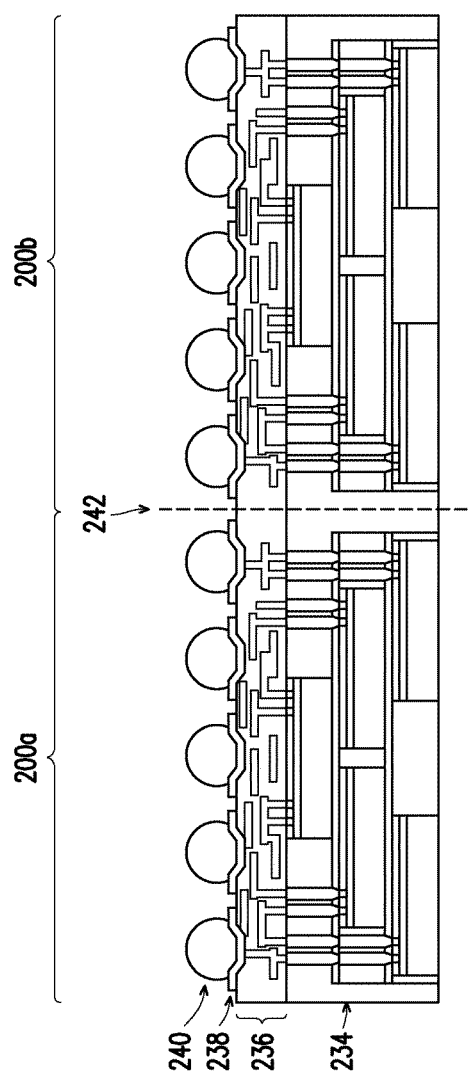

In FIG. 11, a carrier substrate de-bonding is performed to detach (de-bond) the carrier substrate 230 from the back side of the first package structure. De-bonding may be accomplished through, e.g., use of a release layer (not shown), as discussed above. A singulation process is performed by sawing 242 along scribe line regions e.g., between adjacent regions such as the first package region 200a and the second package region 200b.

Figure 12:
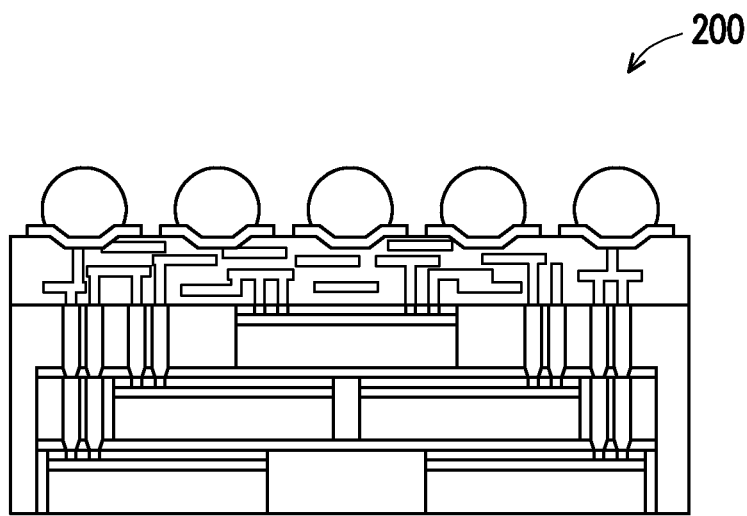

FIG. 12 illustrates a resulting first package structure 200 after singulation, which may be from one of the first package region 200a or the second package region 200b. The resulting first package structure 200 is formed from a 2L MUST package (e.g., one of the MUST packages 228), and another layer of dies (e.g., the integrated circuit dies 232), both of which are packaged as another MUST package. The resulting package is therefore referred to as a three-layer (3L) MUST package, as it comprises a 2L MUST package and a third layer of devices.

Figure 13:
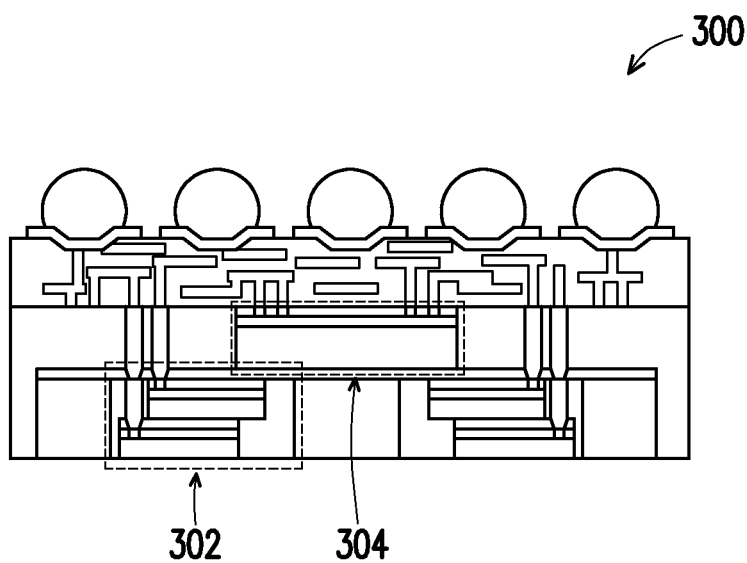
FIG. 13 illustrates a cross-sectional view of a package including multi-stack dies, in accordance with another embodiment.

FIG. 13 illustrates a cross-sectional view of a second package structure 300, according to some embodiments. The second package structure 300 is formed from two 2L MUST packages 302 and one integrated circuit die 304. The second package structure 300 thus has three layers of dies, in a vertical direction, and is therefore referred to as a three-layer (3L) MUST package.

Figure 14:
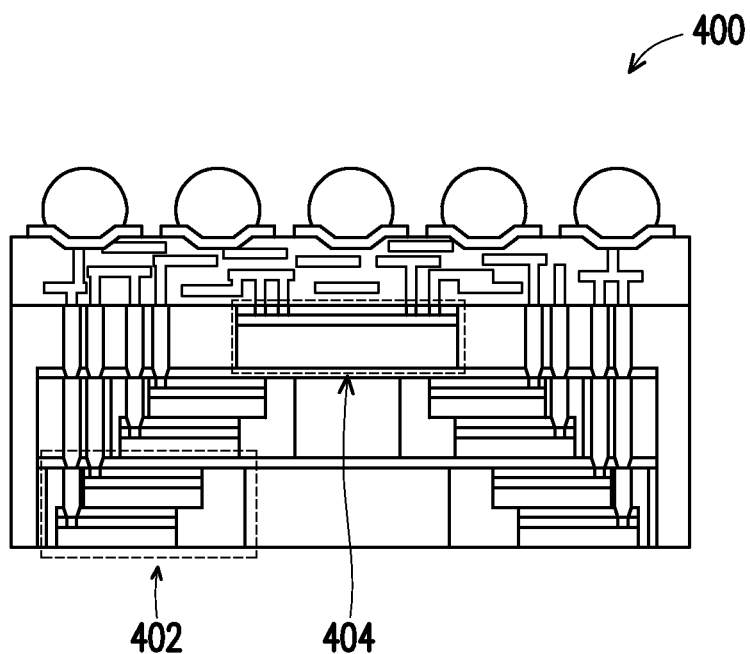
FIG. 14 illustrates a cross-sectional view of a package including multi-stack dies, in accordance with another embodiment.

FIG. 14 illustrates a cross-sectional view of a third package structure 400, according to some embodiments. The third package structure 400 is formed from four 2L MUST packages 402 and one integrated circuit die 404. The third package structure 400 thus has five layers of dies, in a vertical direction, and is therefore referred to as a five-layer (5L) MUST package.

Figure 15:
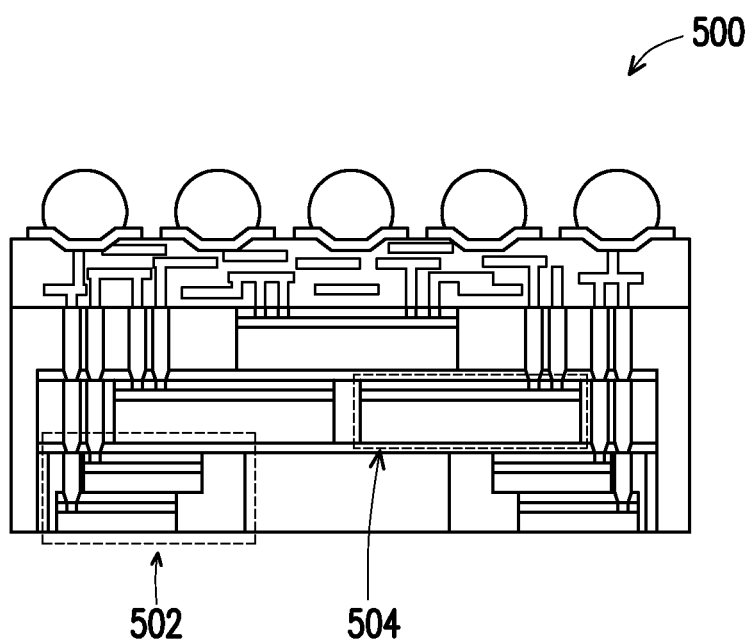
FIG. 15 illustrates a cross-sectional view of a package including multi-stack dies, in accordance with another embodiment.

FIG. 15 illustrates a cross-sectional view of a fourth package structure 500, according to some embodiments. The fourth package structure 500 is formed from two 2L MUST packages 502, and two additional layers of integrated circuit dies 504. The fourth package structure 500 thus has four layers of dies, in a vertical direction, and is therefore referred to as a four-layer (4L) MUST package.

It should be appreciated that there could be additional layers and conductive vias in embodiment package structures. For example, RDLs could be added between the different layers of stacked dies. The RDLs could be formed in place of, e.g., the dielectric layer 210 and/or the dielectric layer 220. In such embodiments, the RDLs may connect to conductive contacts or features on back sides of the dies. Conductive vias, similar to the conductive vias 212, 222, and 224 may also connect the RDLs to external devices.

It should also be appreciated that different quantities of semiconductor devices could be formed in each stacked layer of embodiment package structures. For example, in the embodiments illustrated in FIGS. 2-12, the first level of the first package structure 200 has two integrated circuit dies 204, and the second level of the first package structure 200 has two integrated circuit dies 214. In some embodiments, the first level could include more or fewer semiconductor devices. Likewise, the second level could include more or fewer semiconductor devices. Also, as illustrated in FIGS. 13-15, the semiconductor devices may be MUST packages. Any quantity and type of semiconductor devices could be used to form each level of embodiment package structures. It should also be appreciated that, in the drawings illustrating cross-sectional views of the various package structures, each level of the package structures may include more MUST packages or dies laid out in a plan view.

FIGS. 16-26 illustrate cross-sectional views of intermediate stages in the formation of a fifth package structure, in accordance with some embodiments. A first package region 600a and a second package region 600b for the formation of a first package and a second package, respectively, are illustrated. The first package region 600a and the second package region 600b are similar to the first package region 200a and the second package region 200b described above, respectively, except that first package region 600a and the second package region 600b use different carrier substrate materials for additional support. Details regarding this embodiment that are similar to those for the previously described embodiments will not be repeated herein.

Figure 16:
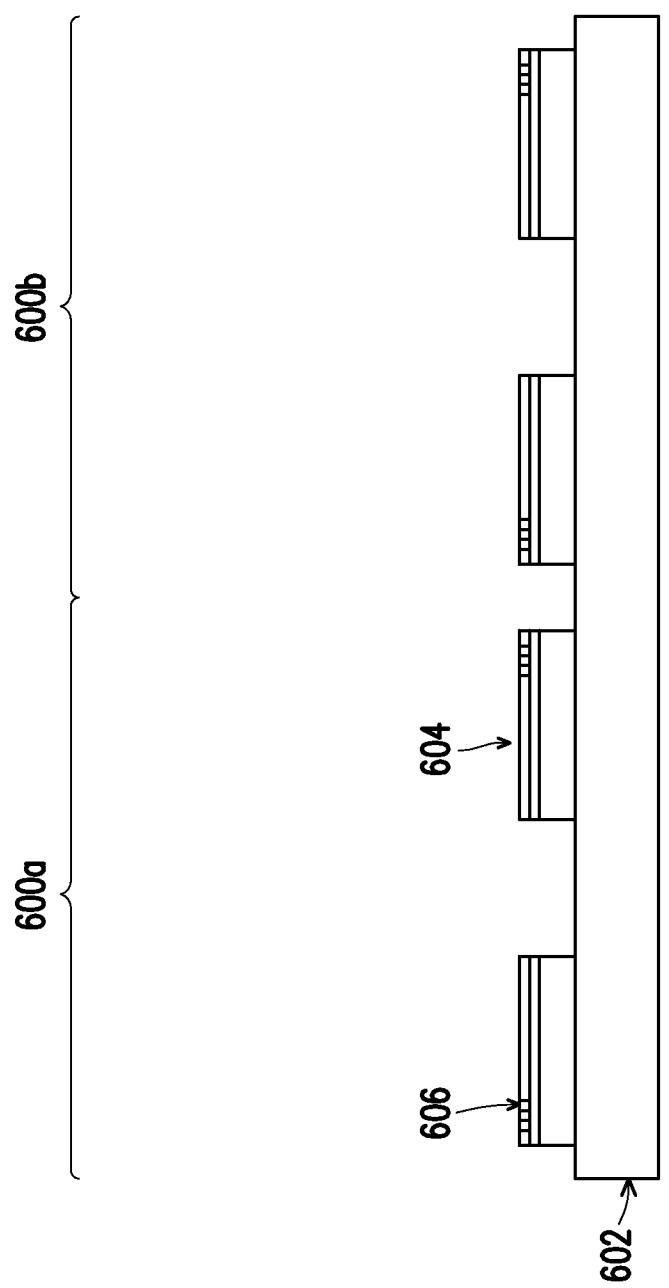
FIGS. 16-26 illustrate cross-sectional views of intermediate stages in the formation of a package including multi-stack dies, in accordance with another embodiment.

In FIG. 16, integrated circuit dies 604, having die connectors 606, are attached to a carrier substrate 602. The carrier substrate 602 may be a semiconductor substrate. The carrier substrate 602 may be, for example, a bulk silicon wafer, a bulk germanium wafer, a semiconductor-on-insulator (SOI) substrate, or a strained semiconductor-on-insulator (SSOI) substrate.

Figure 17:
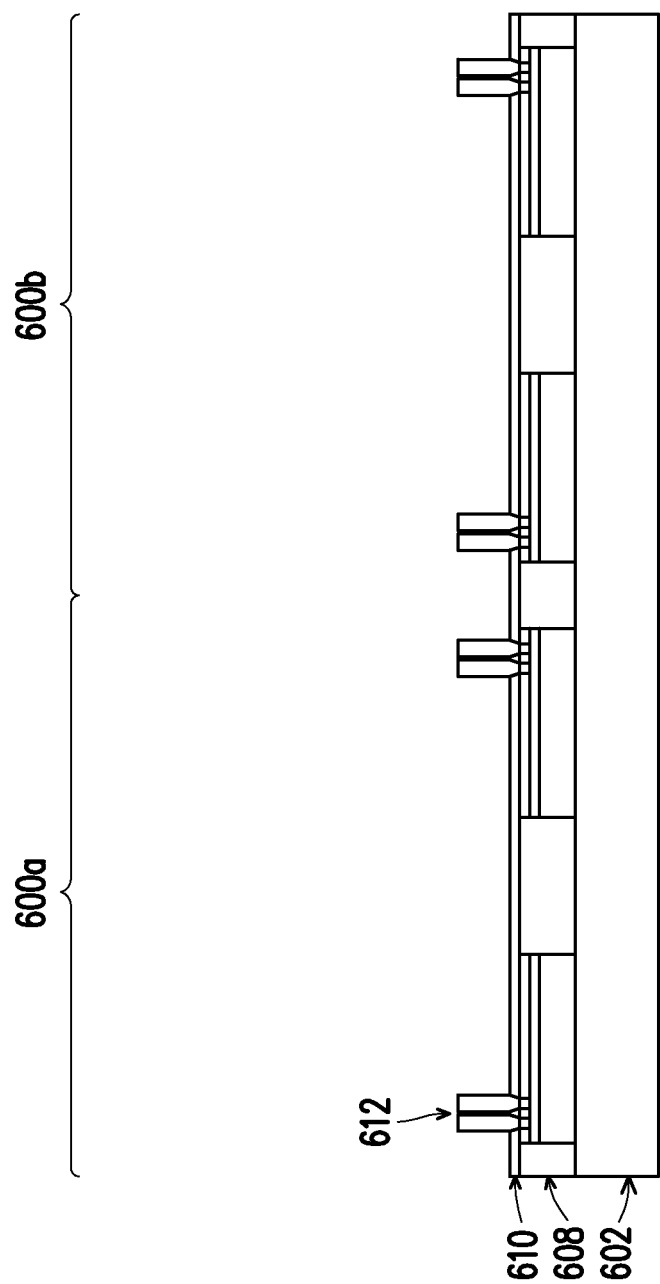

In FIG. 17, an encapsulant 608 is formed on the carrier substrate 602 and around the integrated circuit dies 604. A dielectric layer 610 is then formed over the integrated circuit dies 604 and the encapsulant 608. Conductive vias 612 are then formed contacting the die connectors 606 of the integrated circuit dies 604.

Figure 18:
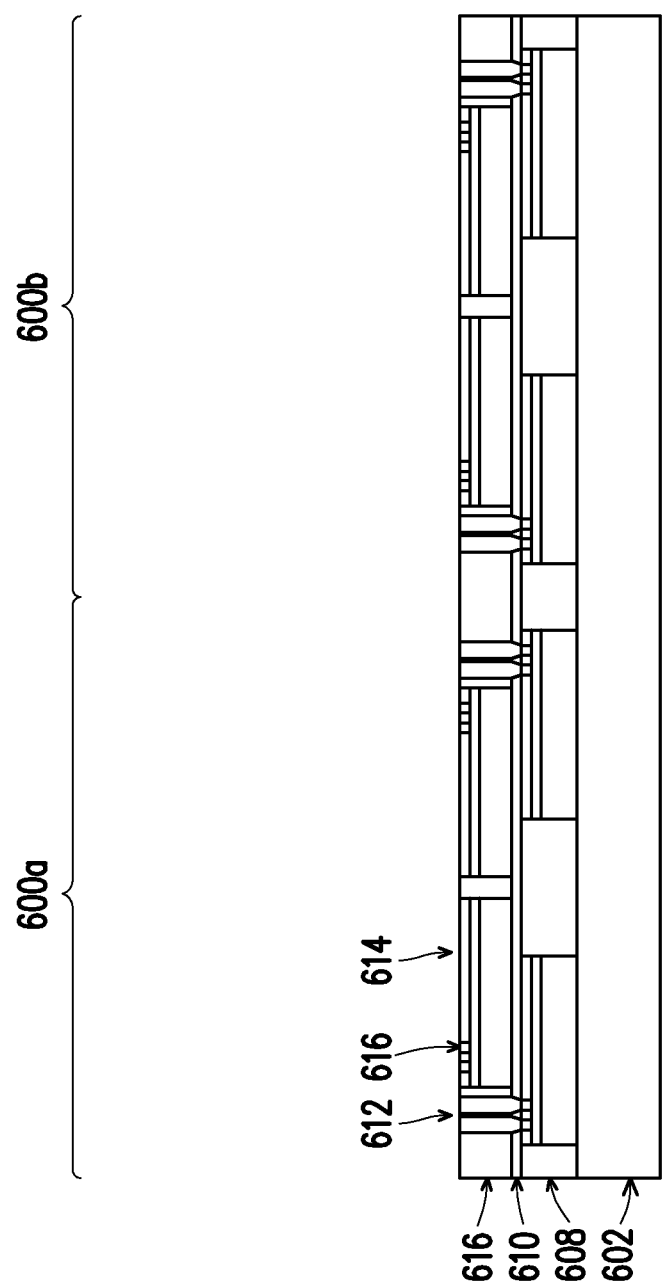

In FIG. 18, integrated circuit dies 614, having die connectors 616, are attached to the dielectric layer 610. An encapsulant 618 is then formed on the dielectric layer 610, around the conductive vias 612 and the integrated circuit dies 614.

Figure 19:
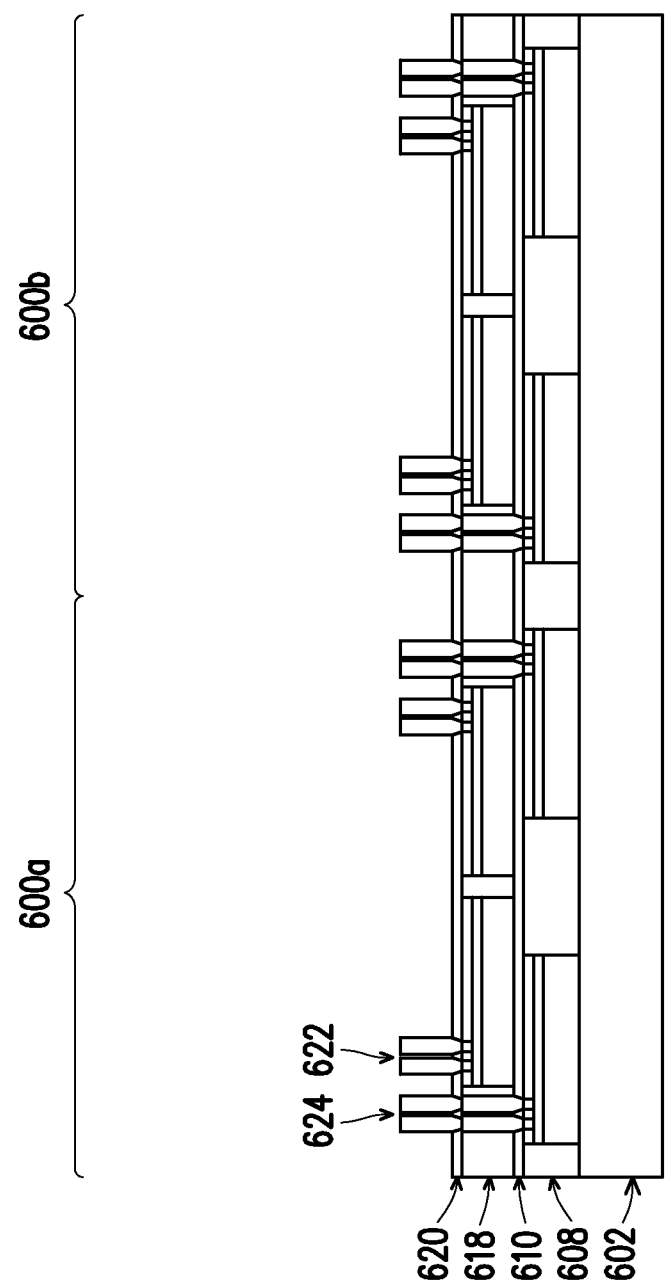

In FIG. 19, a dielectric layer 620 is formed over the integrated circuit dies 614 and the encapsulant 618. Conductive vias 622 and 624 are then formed in contact with the die connectors 616 and the conductive vias 612, respectively. A functional test may then be performed on the dies in the first package region 600a and the second package region 600b, to verify connectivity and functionality of the dies in the regions.

Figure 20:
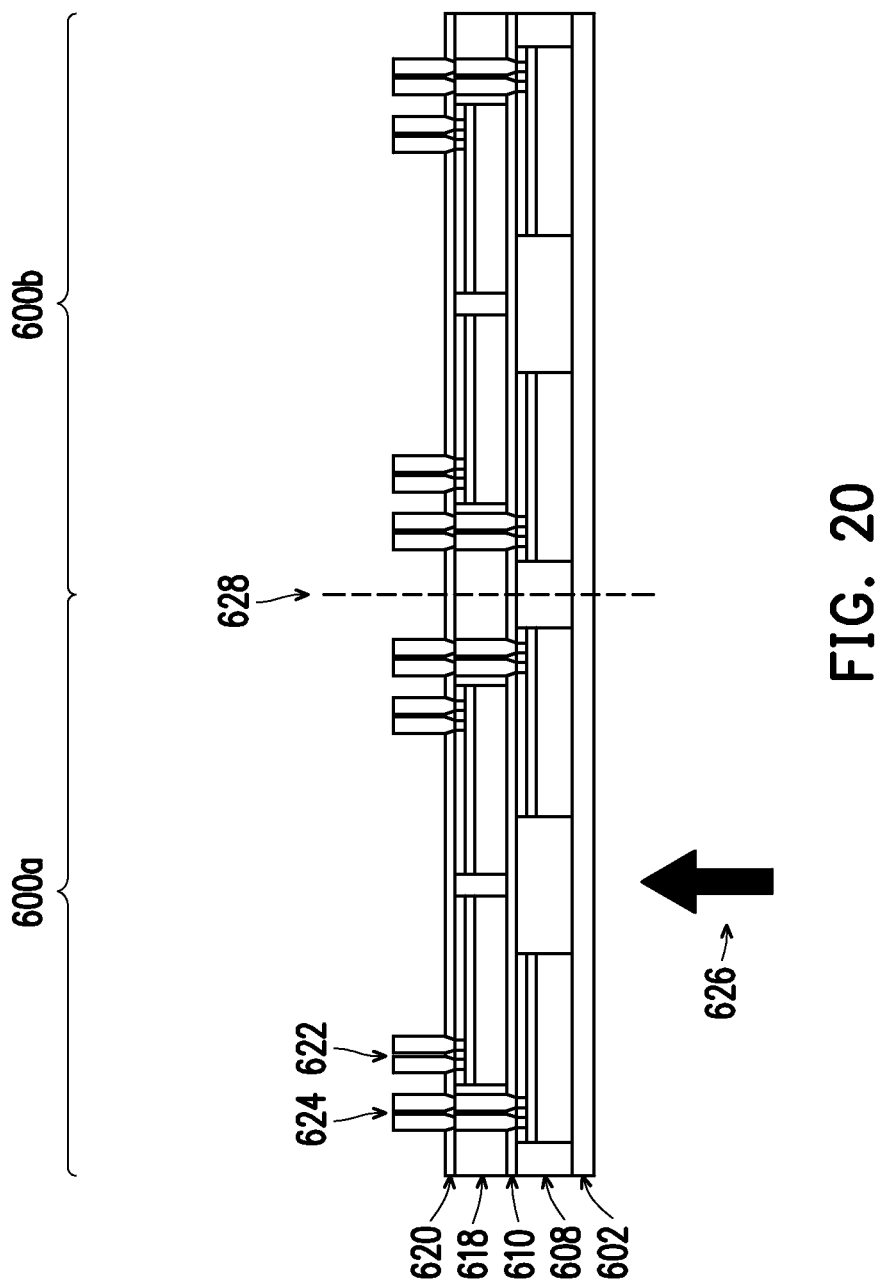

In FIG. 20, the carrier substrate 602 is thinned by a thinning process 626. The thinning process 626 may be, e.g., a back side grind. The thinning process 626 is performed instead of removing the carrier substrate 602. A singulation process is then performed by sawing 628 along scribe line regions e.g., between adjacent regions such as the first package region 600a and the second package region 600b.

Figure 21:
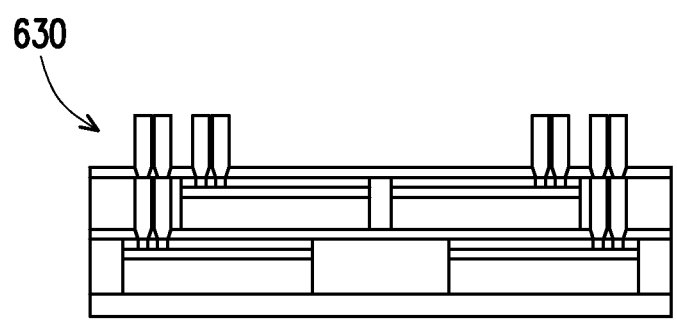

FIG. 21 illustrates an intermediate singulated package, which may be from one of the first package region 600a or the second package region 600b. The singulated packages may also be referred to as MUST packages 630. In the example illustrated in FIGS. 16-21, the MUST packages 630 are 2L MUST packages. The MUST packages 630 could include more layers of stacked dies such that they may be, e.g., 3L MUST packages.

Figure 22:
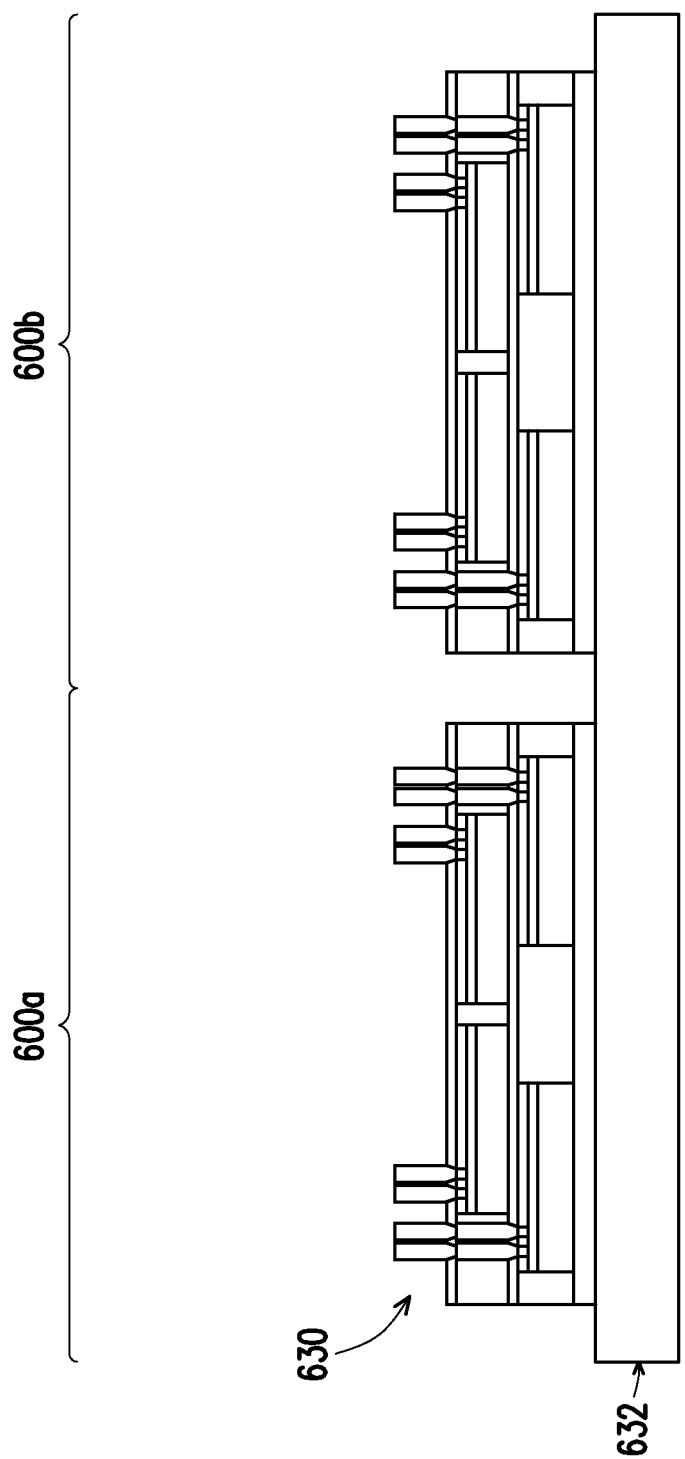

In FIG. 22, the MUST packages 630 are re-attached to a carrier substrate 632. One of the MUST packages 630 are adhered in each of the first package region 600a and the second package region 600b. As discussed above, the MUST packages 630 are known good packages that were determined through functional testing before singulation. The carrier substrate 632 may be, e.g., glass.

Figure 23:
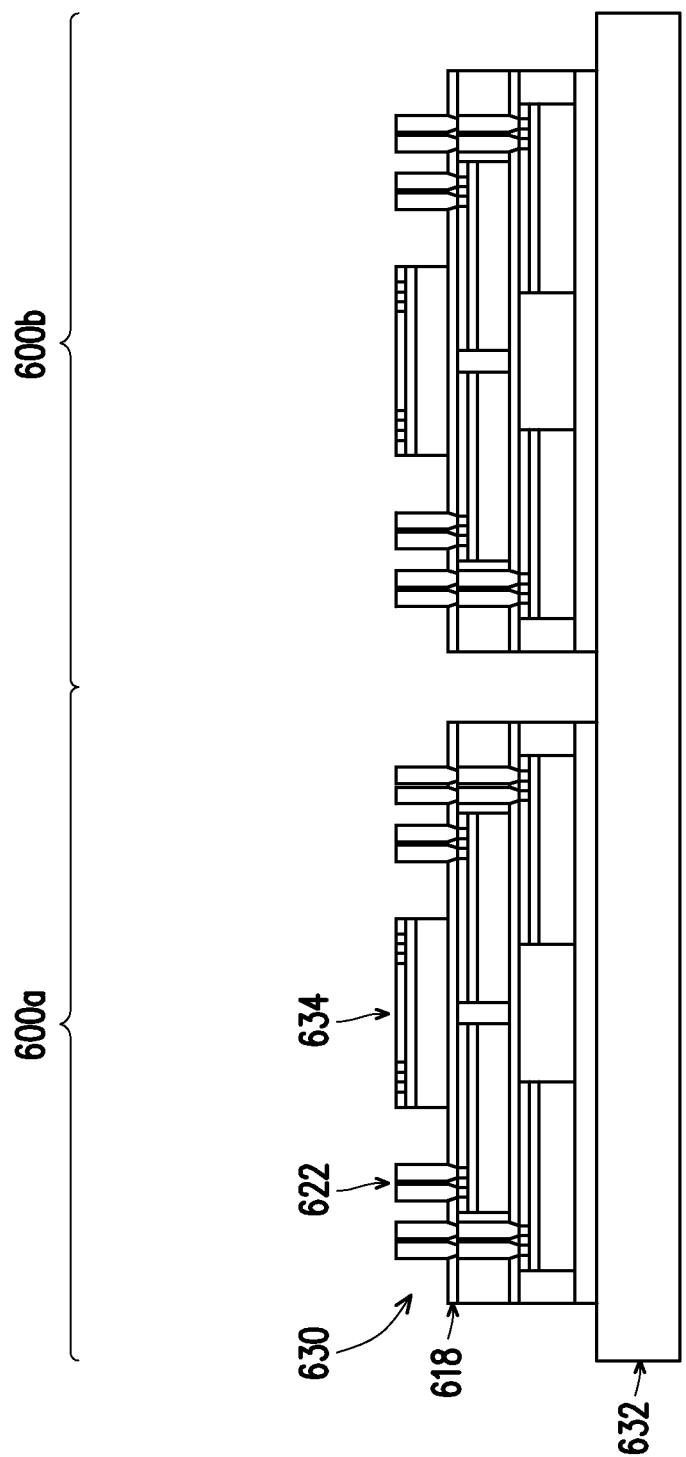

In FIG. 23, integrated circuit dies 634 are attached to the MUST packages 630. The integrated circuit dies 634 are adhered to the dielectric layer 620 and between the conductive vias 622 of the MUST packages 630 by an adhesive (not shown) using, for example, a pick-and-place tool.

Figure 24:
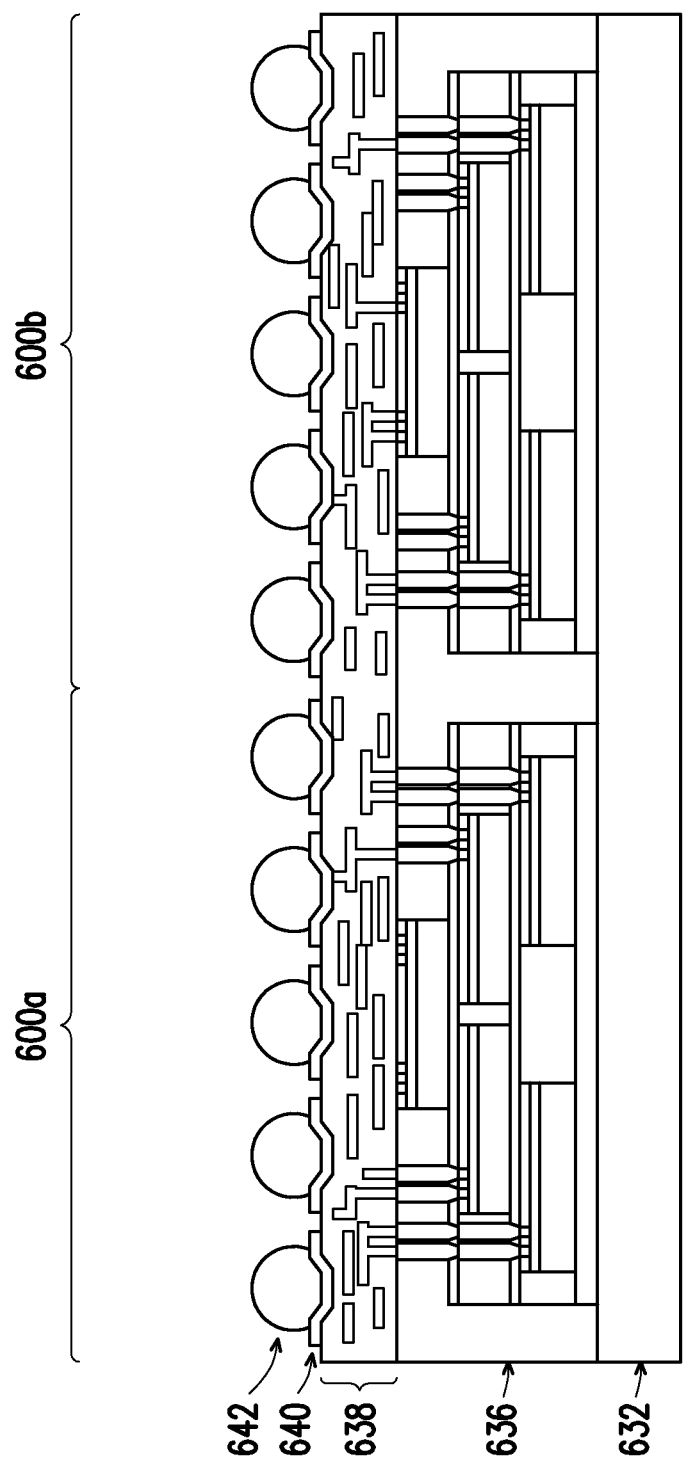

In FIG. 24, an encapsulant 636 is formed on the carrier substrate 632, over the MUST packages 630 and the integrated circuit dies 634. A front-side redistribution structure 638 is then formed over the encapsulant 636, and pads 640 are formed on the front-side redistribution structure 638. Conductive connectors 642 are then formed on the pads 640.

Figure 25:
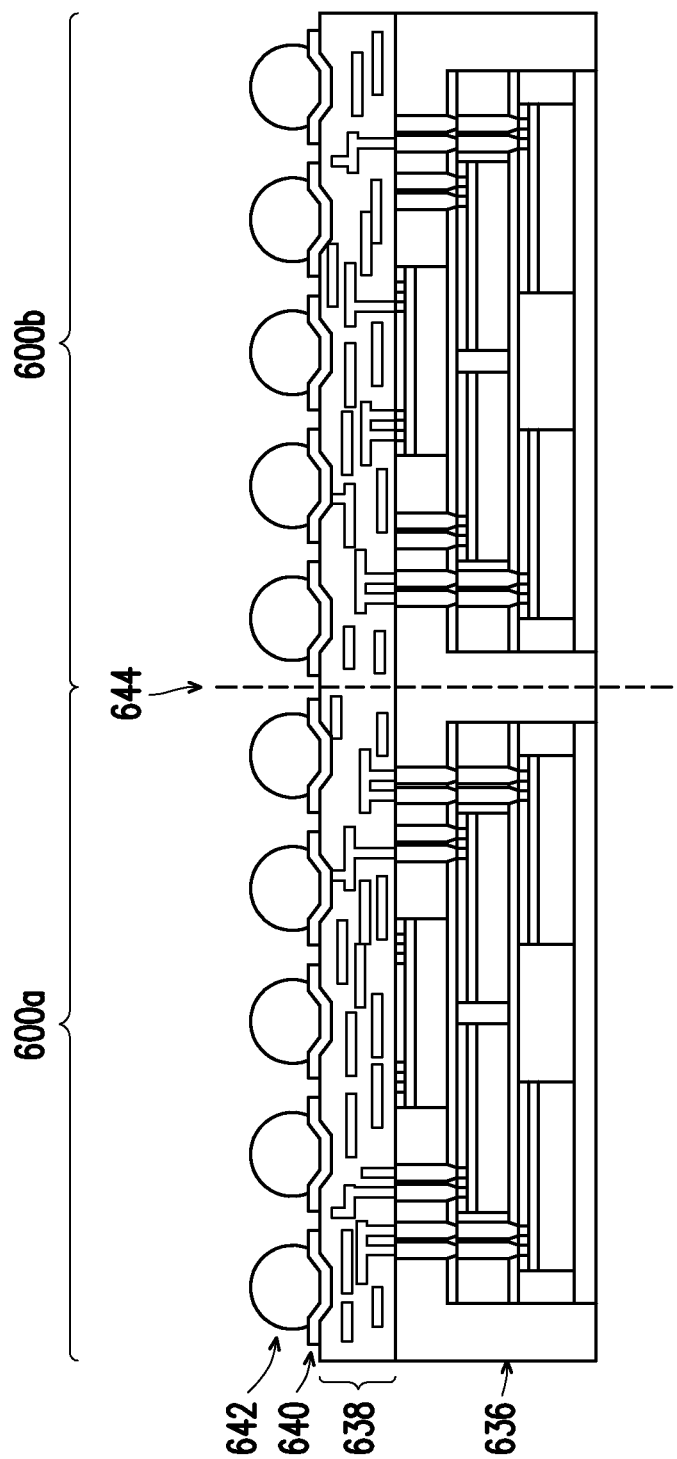

In FIG. 25, a carrier substrate de-bonding is performed to detach (de-bond) the carrier substrate 632 from the back side of the fifth package structure. De-bonding may be accomplished through, e.g., use of a release layer (not shown), as discussed above. A singulation process is performed by sawing 644 along scribe line regions e.g., between adjacent regions such as the first package region 600a and the second package region 600b.

Figure 26:
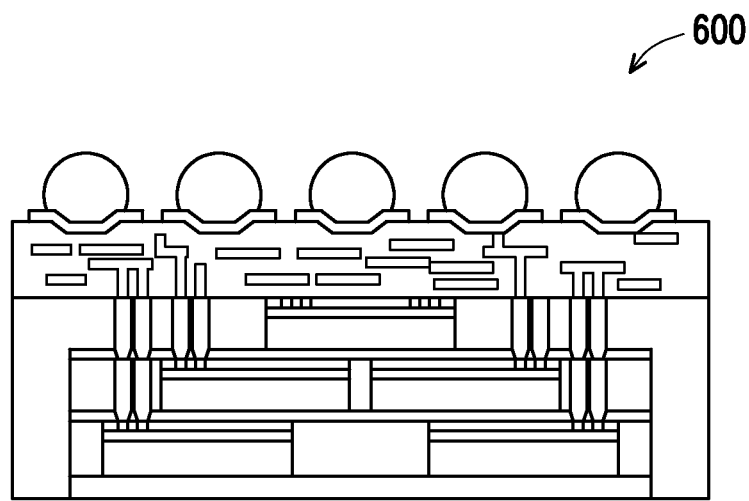

FIG. 26 illustrates a resulting fifth package structure 600 after singulation, which may be from one of the first package region 600a or the second package region 600b. The resulting fifth package structure 600 is a 3L MUST package formed by stacking a 2L MUST package (the MUST packages 630) and a third layer of dies (the integrated circuit dies 634). The third layer of dies may be a MUST package, such as a 1L or a 2L MUST package.

Figure 27:
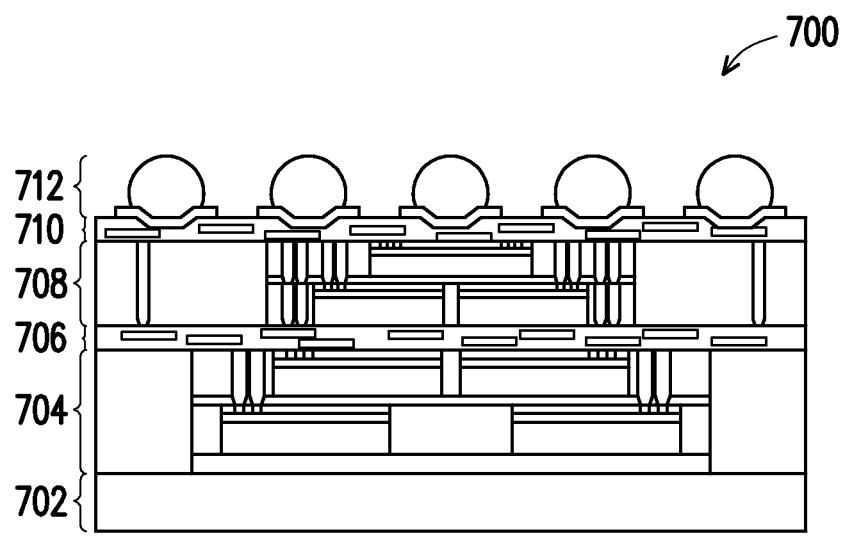
FIG. 27 illustrates a cross-sectional view of a package including multi-stack dies, in accordance with another embodiment.

FIG. 27 illustrates a sixth package structure 700, according to some embodiments. The sixth package structure 700 includes a carrier substrate 702, a first MUST package 704, a first redistribution structure 706, a second MUST package 708, a second redistribution structure 710, and conductive connectors 712. The sixth package structure 700 is formed using MUST packing techniques discussed above, and so specific details will not be repeated.

The first MUST package 704 is formed using techniques similar to those outlined in FIGS. 16-21. For example, the first MUST package 704 is formed on a silicon carrier substrate that was thinned instead of being removed. The first MUST package 704 is formed from two levels of dies that are encapsulated and singulated to reduce warpage stressed within the first MUST package 704. The first level of the first MUST package 704 includes two dies, and the second level of the first MUST package 704 includes two dies. Accordingly, the first MUST package 704 is a 2L MUST package.

The second MUST package 708 is formed using techniques similar to those outlined in FIGS. 2-7. For example, the second MUST package 708 is formed on a glass carrier substrate that is subsequently removed. The second MUST package 708 is formed from two levels of dies that are encapsulated and singulated to reduce warpage stressed within the second MUST package 708. The first level of the second MUST package 708 includes two dies, and the second level of the second MUST package 708 includes one die. Accordingly, the second MUST package 708 is a 2L MUST package. Through mold vias are formed in an encapsulant of the second MUST package 708, which form electrical connections between the second redistribution structure 710, and the first MUST package 704 and/or the first redistribution structure 706.

Figure 28:
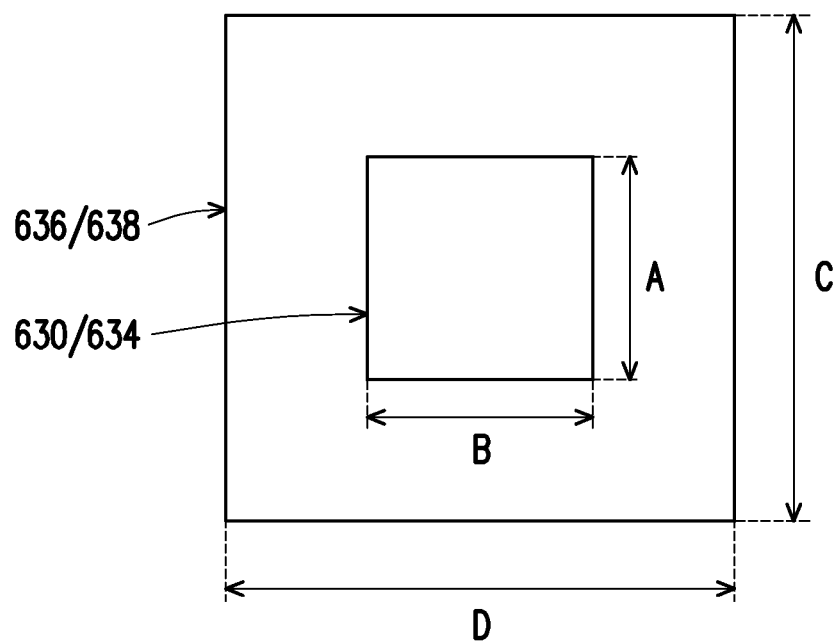
FIG. 28 illustrates a plan view of a package including multi-stack dies, in accordance with some embodiments.

FIG. 28 illustrates a plan view that shows measurements of the fan-out ratio of the fifth package structure 600. The fan-out ratio is the ratio of area occupied by the active semiconductor devices, over the area occupied by the fan-out connectors for the semiconductor devices. Using the dimensions from FIG. 27, the fan-out ratio is determined according to f=AB/CD. In embodiments where a MUST package is produced from several intermediate MUST packages, each of the intermediate MUST packages may have a different fan-out ratio.

Embodiments may achieve advantages. Singulating MUST packages at an intermediate processing step and then re-attaching them to a carrier for further processing may relieve warpage stress in the intermediate MUST packages, which may relieve warpage stress in the final MUST packages. Functionality of the intermediate MUST packages may also be tested so that only known good MUST packages are further processed. Such testing may increase the yield rate of final MUST packages. Forming a carrier substrate of a semiconductor device and thinning it instead of removing it may further increase yield rate by avoiding a de-bonding step. MUST packaging may reduce the height of final devices packages. For example, a 4L MUST package may have a height of about 450 µm.

According to an embodiment, a method comprises forming a first stacked semiconductor device on a first carrier wafer, singulating the first stacked semiconductor device, adhering the first stacked semiconductor device to a second carrier wafer, attaching a second semiconductor device on the first stacked semiconductor device, encapsulating the second semiconductor device and the first stacked semiconductor device, and forming electrical connections on and electrically coupled to the first stacked semiconductor device and the second semiconductor device.

According to an embodiment, a method comprises adhering a first plurality of dies to a device region on a first substrate, forming a first plurality of through vias in electrical connection with the first plurality of dies, attaching a second plurality of dies on the first plurality of dies, the second plurality of dies surrounded by the first plurality of through vias, singulating the device region to form a stacked device, adhering the stacked device to a second substrate, providing a third die on the stacked device, depositing an encapsulant on the stacked device and the third die, and forming a redistribution layer over the encapsulant, the redistribution layer electrically coupled to the first plurality of dies, the second plurality of dies, and the third die.

According to an embodiment, a device comprises a first stacked semiconductor device on a second stacked semiconductor device, the first stacked semiconductor device comprising a plurality of integrated circuit dies, an encapsulant on and around the first stacked semiconductor device and the second stacked semiconductor device, a redistribution layer over the first stacked semiconductor device and the second stacked semiconductor device, and conductive vias extending from the redistribution layer to the first stacked semiconductor device and to the second stacked semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first stacked semiconductor device on a first carrier wafer;
   singulating the first stacked semiconductor device;
   adhering the first stacked semiconductor device to a second carrier wafer;
   attaching a second semiconductor device on the first stacked semiconductor device;
   encapsulating the second semiconductor device and the first stacked semiconductor device;
   singulating the first stacked semiconductor device and the second semiconductor device from the second carrier wafer; and
   forming electrical connections on and electrically coupled to the first stacked semiconductor device and the second semiconductor device.

2. The method of claim 1, wherein the second semiconductor device is a second stacked semiconductor device.

3. The method of claim 2, wherein the first stacked semiconductor device comprises a plurality of memory dies, and wherein the second stacked semiconductor device comprises a plurality of memory dies.

4. The method of claim 1, wherein the second semiconductor device is an integrated circuit die.

5. The method of claim 4, wherein the first stacked semiconductor device comprises a plurality of memory dies, and wherein the second semiconductor device is a processor die.

6. The method of claim 1, wherein no solder is formed in the first stacked semiconductor device during the forming the first stacked semiconductor device.

7. The method of claim 1, wherein singulating the first stacked semiconductor device and the second semiconductor device from the second carrier wafer comprises:
   removing the first stacked semiconductor device from the first carrier wafer; and
   cutting along scribe lines of the first stacked semiconductor device.

8. The method of claim 7, wherein the first carrier wafer is a glass wafer, and wherein the second carrier wafer is a glass wafer.

9. The method of claim 7, wherein the first carrier wafer and the second carrier wafer are the same wafer.

10. The method of claim 1, wherein singulating the first stacked semiconductor device comprises:
thinning the first carrier wafer; and
cutting along scribe lines of the first stacked semiconductor device and the first carrier wafer.

11. The method of claim 10, wherein the first carrier wafer is a glass wafer, and wherein the second carrier wafer is a semiconductor substrate.

12. The method of claim 1, wherein forming the first stacked semiconductor device comprises:
encapsulating a first layer of dies on the first carrier wafer;
forming conductive vias contacting external connectors of each of the first layer of dies;
providing a second layer of dies on the first layer of dies, the second layer of dies surrounded by the conductive vias; and
encapsulating the conductive vias and the second layer of dies.

13. A method comprising:
adhering a first plurality of dies to a device region on a first substrate;
forming a first plurality of through vias in electrical connection with the first plurality of dies;
attaching a second plurality of dies on the first plurality of dies, the second plurality of dies surrounded by the first plurality of through vias;
singulating the device region to form a stacked device;
adhering the stacked device to a second substrate;
providing a third die on the stacked device;
depositing an encapsulant on the stacked device and the third die; and
forming a redistribution layer over the encapsulant, the redistribution layer electrically coupled to the first plurality of dies, the second plurality of dies, and the third die.

14. The method of claim 13, further comprising:
forming a second plurality of through vias in electrical connection with the first plurality of dies and the second plurality of dies.

15. The method of claim 14, further comprising:
forming a first dielectric layer between the first plurality of dies and the second plurality of dies, wherein the first plurality of through vias extend through the first dielectric layer; and
forming a second dielectric layer between the second plurality of dies and the third die, wherein the second plurality of through vias extend through the second dielectric layer.

16. The method of claim 15, wherein the first dielectric layer and the second dielectric layer are, respectively, layers in a first redistribution layer and a second redistribution layer.

17. A method comprising:
forming a first stacked semiconductor device comprising:
placing first integrated circuit dies over a first carrier wafer, each first integrated circuit die of the first integrated circuit dies having a dielectric layer over the first integrated circuit die and facing away from the first carrier wafer;
thinning the first carrier wafer; and
cutting along scribe lines of the first carrier wafer;
forming a second stacked semiconductor device comprising:
adhering the first stacked semiconductor device to a second carrier wafer;
attaching a second integrated circuit die on the first stacked semiconductor device; and
encapsulating the first stacked semiconductor device and the second integrated circuit die; and
forming electrical connections on and electrically coupled to the first integrated circuit dies and the second integrated circuit die.

18. The method of claim 17, wherein the forming the first stacked semiconductor device further comprises:
forming respective encapsulant layers between the respective dielectric layers and surrounding each of the first integrated circuit dies.

19. The method of claim 17, wherein the first stacked semiconductor device has a different fan-out ratio than the second stacked semiconductor device.

20. The method of claim 17, wherein no solder is formed between each of the first integrated circuit dies during the forming the first stacked semiconductor device.

* * * * *